(12) United States Patent
Shen et al.

(10) Patent No.: US 9,065,050 B2
(45) Date of Patent: *Jun. 23, 2015

(54) METHODS FOR FORMING LEAD ZIRCONATE TITANATE NANOPARTICLES

(75) Inventors: I-Yeu Shen, Seattle, WA (US); Guozhong Cao, Seattle, WA (US); Hsien-Lin Huang, Lynnwood, WA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/239,099

(22) PCT Filed: Aug. 17, 2012

(86) PCT No.: PCT/US2012/051371
§ 371 (c)(1),
(2), (4) Date: Aug. 1, 2014

(87) PCT Pub. No.: WO2013/026003
PCT Pub. Date: Feb. 21, 2013

(65) Prior Publication Data
US 2014/0374642 A1     Dec. 25, 2014

Related U.S. Application Data

(63) Continuation of application No. 13/211,554, filed on Aug. 17, 2011, now Pat. No. 9,005,465.

(51) Int. Cl.
C04B 35/00 (2006.01)
C04B 35/491 (2006.01)
(Continued)

(52) U.S. Cl.
CPC .......... *H01L 41/1876* (2013.01); *C01G 25/006* (2013.01); *C04B 35/626* (2013.01);
(Continued)

(58) Field of Classification Search
CPC ............... C04B 2235/5454; C04B 35/491; C04B 35/626; C01P 2004/03; C01P 2004/62; C01P 2004/72; C01G 25/006
USPC ............................ 252/62.9 PZ; 501/134–136
See application file for complete search history.

(56) References Cited

U.S. PATENT DOCUMENTS 5,453,262 A    9/1995 Dawson
6,151,039 A   11/2000 Hmelar
(Continued)

FOREIGN PATENT DOCUMENTS

CN   2012/102955198   8/2012
JP   2002-114519 A    4/2002
(Continued)

OTHER PUBLICATIONS

Khorsandzak et al., "Synthesis and characterization of sol-gel derived single-phase PZT particles in aqueous polyol solution", Aug. 2010, Journal of Optoelectronics and Advanced Materials, vol. 12, No. 8, pp. 1714-1719.*

(Continued)

*Primary Examiner* — C Melissa Koslow
*Assistant Examiner* — Lynne Edmondson
(74) *Attorney, Agent, or Firm* — Christensen O'Connor Johnson Kindness PLLC

(57) ABSTRACT

Methods for forming lead zirconate titanate (PZT) nanoparticles are provided. The PZT nanoparticles are formed from a precursor solution, comprising a source of lead, a source of titanium, a source of zirconium, and a mineralizer, that undergoes a hydro thermal process. The size and morphology of the PZT nanoparticles are controlled, in part, by the heating schedule used during the hydro thermal process.

17 Claims, 14 Drawing Sheets

(51) Int. Cl.
| | |
|---|---|
| H01L 41/187 | (2006.01) |
| C01G 25/00 | (2006.01) |
| C04B 35/626 | (2006.01) |
| B82Y 30/00 | (2011.01) |

(52) U.S. Cl.
CPC ......... C01P2002/72 (2013.01); C01P 2004/03 (2013.01); C01P 2004/62 (2013.01); C04B 35/491 (2013.01); C04B 2235/5454 (2013.01); B82Y 30/00 (2013.01)

(56) References Cited

U.S. PATENT DOCUMENTS

| | | | |
|---|---|---|---|
| 6,319,421 | B1 | 11/2001 | Yun |
| 6,370,964 | B1 | 4/2002 | Chang |
| 8,047,049 | B2 | 11/2011 | Daniel |
| 8,447,530 | B2 | 5/2013 | Pado |
| 8,519,449 | B2 | 8/2013 | Dumitru |
| 8,614,724 | B2 | 12/2013 | Duce |
| 8,766,511 | B2 | 7/2014 | Duce |
| 2006/0216512 | A1 | 9/2006 | Fujikawa |
| 2012/0253698 | A1 | 10/2012 | Cokonaj |
| 2013/0044175 | A1* | 2/2013 | Duce et al. ............ 347/110 |

FOREIGN PATENT DOCUMENTS

| | | | |
|---|---|---|---|
| JP | 2008172157 | A | 7/2008 |
| JP | 2009031048 | A | 2/2009 |
| KR | 10-2000-0028548 | A | 5/2000 |
| KR | 10-2008-0111641 | A | 12/2008 |
| KR | 1020070059845 | A * | 12/2008 |
| WO | 90/06292 | A1 | 6/1990 |
| WO | 2005/069858 | A2 | 8/2005 |
| WO | 2011002689 | A1 | 1/2011 |
| WO | 2013/026003 | A2 | 2/2013 |

OTHER PUBLICATIONS

Sangsubun et al., "Effect of Calcination on Phase and Morphology of Sol-gel Derived PZTN Powders", available online Aug. 22, 2008, Advanced Materials Research, vols. 55-57, pp. 77-80.*
Machine translation of KR1020070059845A from KIPO, printed Mar. 26, 2015.*
International Search Report and the Written Opinion mailed Feb. 26, 2013, issued in corresponding International Application No. PCT/US2012/051371, filed Aug. 17, 2012, 9 pages.
International Preliminary Report on Patentability mailed Feb. 18, 2014, issued in corresponding International Application No. PCT/US2012/051371, filed Aug. 17, 2012, 7 pages.
Bortolani, F., and R.A. Dorey, "Molten Salt Synthesis of PZT Powder for Direct Write Inks," Journal of the European Ceramic Society 30(10):2073-2079, Aug. 2010.
Byrappa, K., and M. Yoshimura, "Handbook of Hydrothermal Technology: A Technology for Crystal Growth and Materials Processing," Noyes Publications, Park Ridge, N.J.; William Andrew Publishing, Norwich, N.Y., 2001, pp. 1, 53, 82, 161, 198, 315, 415, 618, 691, and 754.
Das, R.N., and P. Pramanik, "In Situ Synthesis of Nanosized PZT Powders in the Precursor Material and the Influence of Particle Size on the Dielectric Property," Nanostructured Materials 10(8):1371-1377, Dec. 1998.
Deng, Y., et al., "Hydrothermal Synthesis and Characterization of Nanocrystalline PZT Powders," Materials Letters 57(11):1675-1678, Mar. 2003.

Harada, S., and S. Dunn, "Low Temperature Hydrothermal Routes to Various PZT Stoichiometries," Journal of Electroceramics 20(2):65-71, Apr. 2008.
Jeon, J.S., "Optimization of PZT Processing Using Thermal Ink-Jet Printing," master's thesis, Massachusetts Institute of Technology, Cambridge, Mass., Jun. 2008, 29 pages.
Khorsand Zak, A., et al., "Synthesis and Characterization of Sol-Gel Derived Single-Phase PZT Nanoparticles in Aqueous Polyol Solution," Journal of Optoelectronics and Advanced Materials 12(8):1714-1719, Aug. 2010.
Non-Final Office Action dated Jun. 12, 2014, issued in U.S. Appl. No. 13/410,124, filed Mar. 1, 2012, 7 pages.
Qiu, Z.-C., et al., "Hydrothermal Synthesis of $Pb(Zr_{0.52}Ti_{0.48})O_3$ Powders at Low Temperature and Low Alkaline Concentration," Bulletin of Materials Science 32(2):193-197, Apr. 2009.
Sangsubun, C., et al., "Effect of Calcination Temperature on Phase and Morphology of Sol-Gel Derived PZTN Powders," Advanced Materials Research 55-57:77-80, available online since Aug. 22, 2008.
Su, B., et al., "Control of the Particle Size and Morphology of Hydrothermally Synthesised Lead Zirconate Titanate Powders," Journal of Materials Science 39(21):6439-6447, Nov. 2004.
Traianidis, M., et al., "Hydrothermal Synthesis of Lead Zirconium Titanate (PZT) Powders and Their Characteristics," Journal of the European Ceramic Society 19(6-7):1023-1026, Jun. 1999.
Wang, S.F., et al., "Characterization of Hydrothermally Synthesized Lead Zirconate Titanate (PZT) Ceramics," Materials Chemistry and Physics 87(1):53-58, Sep. 2004.
Curtis, C.J., et al., "Multi-Layer Inkjet Printed Contacts for Silicon Solar Cells," Conference Record of the 2006 IEEE 4th World Conference on Photovoltaic Energy Conversion, Waikoloa, Hawaii, May 1, 2006, pp. 1392-1394, XP031007577, ISBN:978-1-4244-0016-4.
Dodds, J.S., et al., "Piezoelectric Characterization of PVDF-TrFE Thin Films Enhanced With ZnO Nanoparticles," IEEE Sensors Journal 12(6):1889-1890, Jun. 2012.
Extended European Search Report dated Nov. 28, 2012, issued in corresponding European Patent Application No. 12175708.2, filed Jul. 10, 2012, 6 pages.
European Patent Office Extended European Search Report for Counterpart EP Patent Application No. 12178902, Applicant The Boeing Company et al., dated Feb. 13, 2014, 6 pages.
International Preliminary Report on Patentability and Written Opinion mailed Feb. 26, 2013, issued in corresponding International Patent Application No. PCT/US2012/051371, filed Aug. 17, 2012, 7 pages.
Kittila, M.,et al., "Direct Gravure Printing (DGP) Method for Printing Fine-Line Electrical Circuits on Ceramics," IEEE Transactions on Electronics Packaging Manufacturing, vol. 27, No. 2, Apr. 1, 2004, pp. 109-114, XP011123267, ISSN:1521-334X, DOI:10.1109/TEPM.2004.837959.
Lin, Y., et al., "Enhanced Piezoelectric Properties of Lead Zirconate Titanate Sol-Gel Derived Ceramics Using Single Crystal PbZr 0.52 Ti 0.48 O3 Cubes," Journal of Applied Physics 108(6):064108-1-064108-6, Sep. 2010.
Loh, K.J., and D. Chang, "Zinc Oxide Nanoparticle-Polymeric Thin Films for Dynamic Strain Sensing," Journal of Materials Science 46(1):228-237, Jan. 2011.
Duce, J.L., "Structures With PZT Nanoparticle Ink Based Piezoelectric Sensor Assembly," U.S. Appl. No. 14/138,120, filed Dec. 22, 2013.
Shen, I.-Y., "Method for Forming Lead Zirconate Titanate Nanoparticles," U.S. Appl. No. 14/239,099, filed Aug. 1, 2014.
Wang, Z., et al., "Dense PZT Thick Films Derived From Sol-Gel Based Nanocomposite Process," Materials Science and Engineering: B 99(1-3):56-62, May 2003.

* cited by examiner

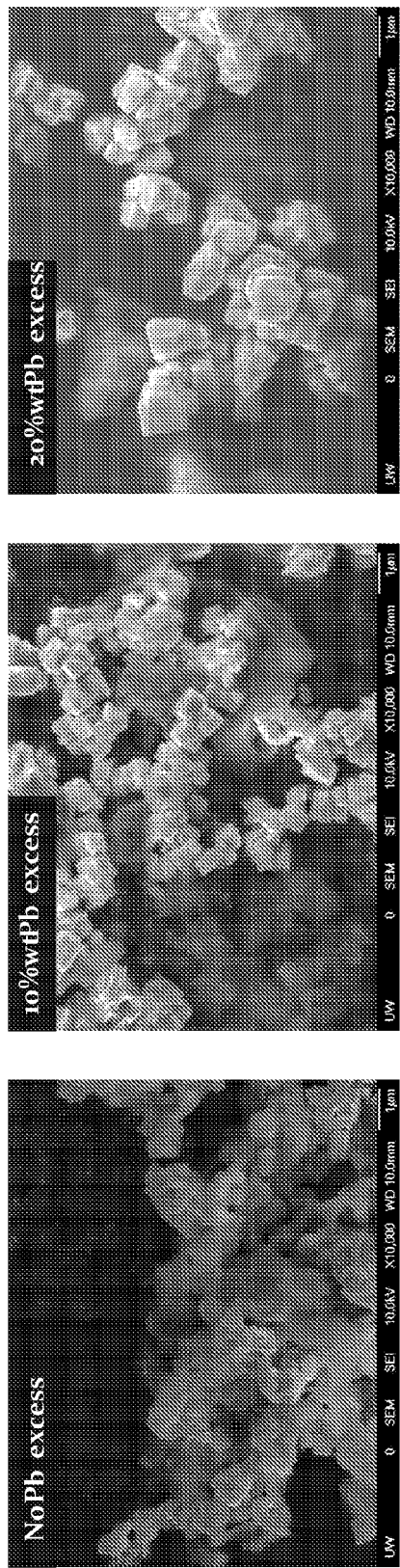
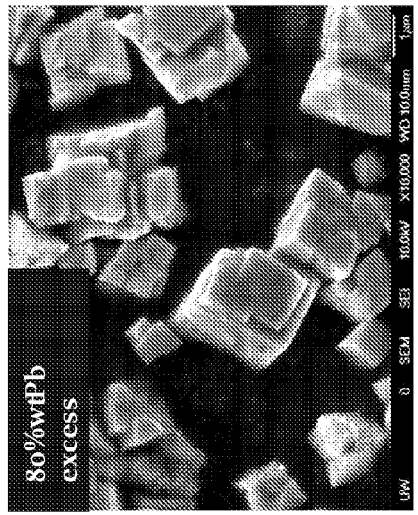
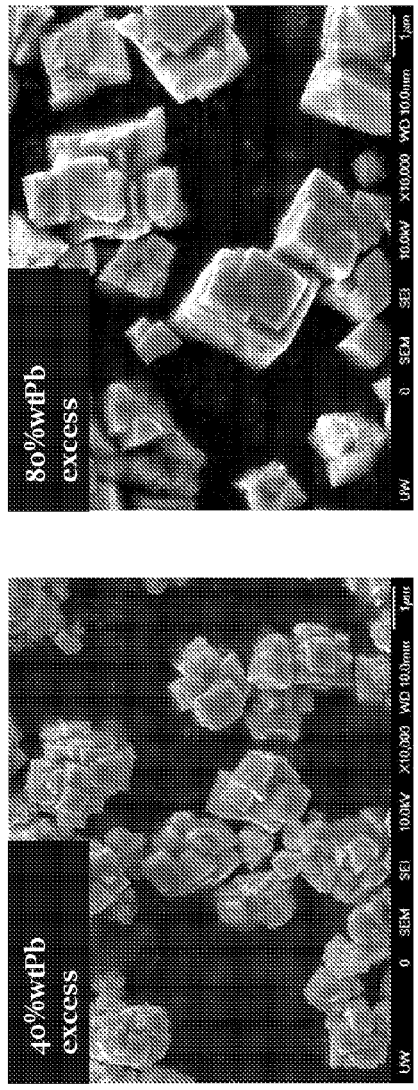
Fig.9A. Fig.9B. Fig.9C. Fig.9D. Fig.9E.

METHODS FOR FORMING LEAD ZIRCONATE TITANATE NANOPARTICLES

CROSS REFERENCE TO RELATED APPLICATIONS

This application claims the benefit of U.S. patent application Ser. No. 13/211,554, filed Aug. 17, 2011, which is in turn related to contemporaneously filed U.S. patent application Ser. No. 13/212,037, titled "METHOD AND SYSTEM OF FABRICATING PZT NANOPARTICLE INK BASED PIEZOELECTRIC SENSOR", filed on Aug. 17, 2011, and U.S. patent application Ser. No. 13/212,123 titled "METHOD AND SYSTEM FOR DISTRIBUTED NETWORK OF NANOPARTICLE INK BASED PIEZOELECTRIC SENSORS FOR STRUCTURAL HEALTH MONITORING", filed on Aug. 17, 2011. The contents of these applications are hereby incorporated by reference in their entireties.

BACKGROUND

Lead zirconate titanate (PZT) is a piezoelectric ceramic material that is widely used for its high piezoelectric coefficients. PZT has a perovskite structure with a chemical formula as $ABX_3$, where A is lead, B is mixture of zirconium and titanium, and X is oxygen. PZT appears as a solid with phases of lead zirconate oxide ($PbZrO_3$) and lead titanate oxide ($PbTiO_3$).

Formation of PZT films typically requires sintering at a high temperature (e.g., 650° C.), which makes application of PZT difficult on non-planar (e.g., "three dimensional") substrates because the resulting films are brittle (because they are sintered) and difficult to pattern.

What is desired, therefore, is a relatively low temperature method for forming PZT, such that PZT can be deposited conformally on non-planar substrates.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect, a method is provided for forming a plurality of PZT nanoparticles (also referred to herein as "nanocrystals"). In one embodiment, the method includes the steps of:

(a) providing an aqueous precursor solution comprising a mineraliser solution, a source of titanium, a source of zirconium, and a source of lead; and (b) heating the precursor solution to produce PZT nanoparticles, wherein heating the precursor solution comprises a first heating schedule that includes at least the sequential steps of:

(i) heating the precursor solution at a first rate to a first temperature, wherein said first rate is greater than about 1° C./min, and wherein said first temperature is between about 120° C. and about 350° C.;

(ii) holding for a first hold time at the first temperature, wherein said first hold time is between about 5 and about 300 minutes; and (iii) cooling at a second rate to provide a nanoparticle PZT solution comprising a suspended plurality of perovskite PZT nanoparticles having a smallest dimension of between about 20 nm and about 1000 nm, wherein said second rate is greater than about 1° C./min.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 9A-9E are scanning electron micrographs of PZT nanoparticles formed in accordance with embodiments provided herein;

DETAILED DESCRIPTION

Figure 1:
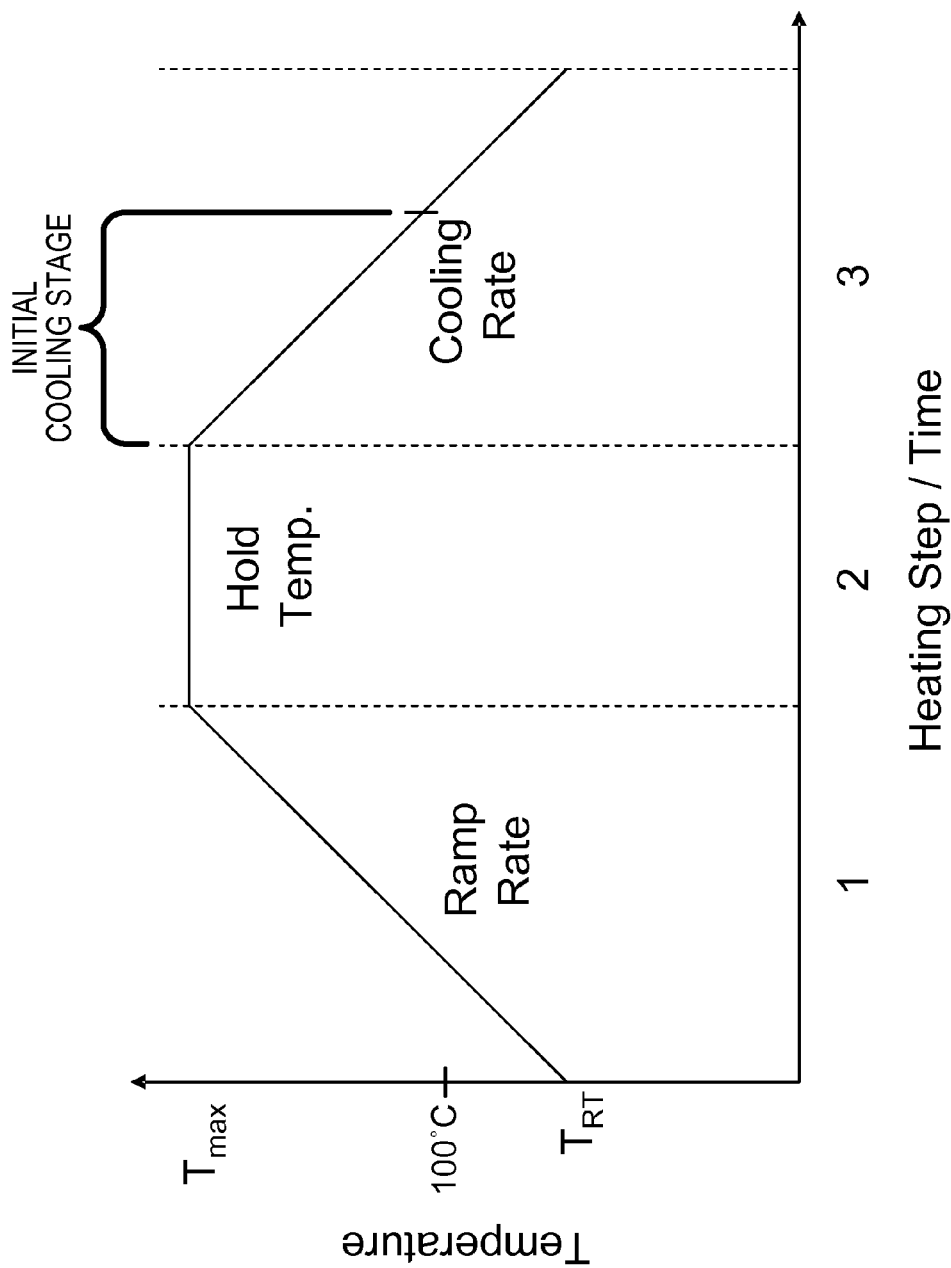
FIG. 1 graphically illustrates a heating schedule as used in the methods for forming PZT nanoparticles in accordance with embodiments provided herein.

Methods for forming lead zirconate titanate (PZT) nanoparticles are provided. The PZT nanoparticles are formed from a precursor solution—comprising a source of lead, a source of titanium, a source of zirconium, and a mineraliser—that undergoes a hydrothermal process according to the following reaction ("the hydrothermal process"):

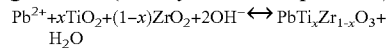
$Pb^{2+} + xTiO_2 + (1-x)ZrO_2 + 2OH^- \leftrightarrow PbTi_xZr_{1-x}O_3 + H_2O$ The formed PZT nanoparticles are useful, for example, as piezoelectric materials.

Previous syntheses of PZT particles demonstrate the tremendous synthetic challenges in size control, size distribution, morphology, and agglomeration of formed PZT particles. According to the provided methods, the characteristics of the formed PZT nanoparticles are controlled to a greater extent than previously obtainable. Of particular interest is providing a plurality of PZT nanoparticles with the smallest particle size while maintaining the highest possible purity of the perovskite PZT structure.

The fabrication of the smallest possible PZT nanoparticles is of use, for example, if the PZT nanoparticles are to be incorporated into a solution for solution deposition (e.g., using a spray nozzle) to produce a large area coating. Spray nozzles are as small as hundreds of nanometers in diameter, meaning that if PZT nanoparticles in solution are to be sprayed through such a nozzle, the PZT particles must be at least half the size of the nozzle.

In the provided methods, the properties of the formed PZT nanoparticles are dictated at least by the mineraliser concentration, processing time, heating rate, and cooling rate.

In one aspect, a method is provided for forming a plurality of PZT nanoparticles (also referred to herein as "nanocrystals"). In one embodiment, the method includes the steps of:

(a) providing an aqueous precursor solution comprising a mineraliser solution, a source of titanium, a source of zirconium, and a source of lead; and (b) heating the precursor solution to produce PZT nanoparticles, wherein heating the precursor solution comprises a first heating schedule that includes at least the sequential steps of:

(i) heating the precursor solution at a first rate to a first temperature, wherein said first rate is greater than about 1° C./min, and wherein said first temperature is between about 120° C. and about 350° C.;

(ii) holding for a first hold time at the first temperature, wherein said first hold time is between about 5 and about 300 minutes; and (iii) cooling at a second rate to provide a nanoparticle PZT solution comprising a suspended plurality of perovskite PZT nanoparticles having a smallest dimension of between about 20 nm and about 1000 nm, wherein said second rate is greater than about 1° C./min.

Precursor Solution

The precursor solution is defined by reactants that are processed to form PZT nanoparticles. Specifically, the precursor solution includes at least a source of titanium, a source of zirconium, a source of lead, and a mineraliser. The precursor solution optionally includes additional solvents or stabilizers, as will be discussed in more detail below.

The components of the precursor solution may all be combined simultaneously in a single reaction vessel, or may be combined stepwise, depending on the character of the components of the precursor solution and a potential need to minimize interaction between the components of the precursor prior to hydrothermal reaction to produce PZT nanoparticles. For example, as set forth below in Example 1, the source of titanium and the source of zinc may be combined to form a precursor gel, which is then combined with a source of lead in aqueous form and the mineraliser to provide the precursor solution. Such an approach allows for maximum control over the relative molar amounts of each of the reactants (i.e., the sources of titanium, zirconium, and lead).

The sources of lead, titanium, and zirconium are present in the precursor solution in molar amounts sufficient to obtain PZT nanoparticles having the formula $Pb_xZi_yTi_zO_3$, wherein x is between 0.8 and 2, wherein y is between 0.4 and 0.6, and wherein y plus z equals 1. For example, a common formula for perovskite PZT nanoparticles is $Pb(Zr_{0.52}Ti_{0.48})O_3$. However, it will be appreciated by those of skill in the art that the relative amounts of lead, zirconium, and titanium can be modified within the provided ranges to produce the desired characteristics of PZT nanoparticles.

The source of titanium in the precursor solution can be any titanium-containing compound that allows for the formation of PZT particles according to the method provided herein. In one embodiment, the source of titanium is $Ti[OCH(CH_3)_2]_4$. Additional sources of titanium include $TiO2$, $TiO2*nH2O$, $Ti(OC4H9)$, $Ti(NO3)2$, $TiCl3$, and $TiCl4$.

The source of zirconium in the precursor solution can be any zirconium-containing compound that allows for the formation of PZT particles according to the method provided herein. In one embodiment, the source of zirconium is $Zr[O(CH_2)_2CH_3]_4$. Additional sources of zirconium include $Zr(NO3)4*5H2O$, $ZrOCl2*8H2O$, $ZrO2*nH2O$, and $ZrO2$.

The source of lead in the precursor solution can be any lead-containing compound that allows for the formation of PZT particles according to the method provided herein. In one embodiment, the source of lead is $Pb(CH_3COOH)_2$. Additional sources of lead include $Pb(NO3)2$, $Pb(OH)2$, $PbO$, $Pb2O3$, and $PbO2$.

In certain embodiments, excess lead is added to the precursor solution. As used herein, the term "excess lead" refers to a ratio amount greater than one for the source of lead. Excess lead is a means for exerting further control over the characteristics of the PZT nanoparticles. In certain embodiments, the excess lead is from about 10% to about 90% by weight. In certain embodiments, the excess lead is from about 50% to about 90% by weight. In certain embodiments, the excess lead is from about 40% to about 60% by weight. Typically, the excess lead is achieved in the precursor solution by adding an excess amount of the same source of lead as described above. For example, if the source of lead is lead acetate trihydrate, any amount of lead acetate trihydrate added to the precursor solution that results in the ratio of the lead acetate trihydrate to be greater than one compared to the source of zirconium and the source of titanium will be considered an excess amount of lead. In certain embodiments, the excess amount of lead comes from a second, different, source of lead.

Excess lead does not alter the chemical composition of the PZT nanoparticles, but instead modifies the hydrothermal reaction conditions to produce several desirable effects on the formed PZT nanoparticles. While the excess lead does not alter the fundamental crystal structure of the PZT nanoparticles, it improves morphology, reduces amorphous byproducts, and reduces the degree of agglomeration between particles. The specific benefits of excess lead are set forth below in Example 2.

One less desirable side effect of excess lead is that it also leads to the formation of a lead oxide compound that is an impurity. However, the lead oxide impurity can be removed by washing the formed PZT nanoparticles with an appropriate solvent (e.g., diluted acetic acid).

The mineraliser in the precursor solution facilitates the formation of PZT during the hydrothermal process. The mineraliser acts as a source of hydroxide ions to facilitate the hydrothermal synthesis of PZT. Representative mineralisers include KOH, NaOH, LiOH, $NH_4OH$, and combinations thereof. The concentration of the mineraliser in the precursor solution is from about 0.2 M to about 15 M. The optimal mineraliser concentration depends on the conditions of the hydrothermal process, as is known to those of skill in the art. In the representative embodiment of Example 3, a very specific range of mineraliser concentrations, 2.75 M to 3.5 M, were used in an optimized process for synthesizing high volumes of PZT nanoparticles. Accordingly, in one embodiment, the mineraliser concentration is from about 2.75 M to about 3.5 M.

The concentration of the mineraliser affects the size of PZT nanoparticles produced. For example, as disclosed below in Example 1, similar PZT nanoparticles formed using 5 M and 10 M KOH mineraliser have similar morphology, but 5 M mineraliser results in smaller nanoparticles than those formed with 10 M mineraliser, if all other processing conditions are the same.

In certain embodiments, a stabilizer is added to the precursor to prevent gelation and/or precipitation of certain components of the precursor prior to the hydrothermal process. That is, stabilizers may be required to maintain all of the necessary components of the precursor in solution prior to the hydrothermal process. For example, in one embodiment, acetylacetone ("AcAc") is added to the source of titanium (e.g., titanium isopropoxide) to prevent gelation and precipitation prior to reaction to form PZT. Another stabilizer useful in the methods is propoxide.

The precursor solution is typically aqueous, although it will be appreciated that any other solvent capable of solvating the components of the precursor solution and facilitating the formation of PZT nanoparticles can also be used. For example, the precursor solution can be aqueous, a mixture of water and an organic solvent, or a weak organic acid. Exemplary non-water components of the solution include ethylenediamine, $CH_2Cl_2$, ammonium salt, and acetic acid.

In an exemplary embodiment, described further in Example 1, the precursor solution comprises KOH as the mineraliser solution, titanium isopropoxide as the source of titanium, zirconium n-propoxide as the source of zirconium, lead acetate trihydrate as the source of lead, acetylacetone as a stabilizer, and water. The lead acetate trihydrate, zirconium n-propoxide, and titanium isopropoxide are present in the precursor in a weight ratio of from about 1 to about 2 parts lead acetate trihydrate, from about 0.5 to about 1 parts zirconium n-propoxide, and from about 0.8 to about 1.6 parts titanium isopropoxide. The KOH mineraliser solution is from about 0.2 to about 15 M.

Heating Schedule

PZT nanoparticles are formed through hydrothermal processing of the precursor solution. The hydrothermal process includes a heating schedule comprising a heating ramp to a first temperature, a hold at the first temperature, and a cooling ramp to room temperature, as is graphically illustrated in FIG. 1. The temperatures referred to herein are specifically the temperature of the precursor solution itself.

The heating schedule is performed under pressure greater than 1 atm. Accordingly, the precursor solution is contained within an apparatus configured to both heat and pressurize. In certain embodiments, the pressure applied during the heating schedule is from about 1 atm to about 20 atm. In an exemplary embodiment, the precursor solution is contained within an autoclave and autogenous pressure builds in the autoclave over the course of the heating schedule. Alternatively, a constant pressure can be provided by a pump or other apparatus known to those of skill in the art. The heat and pressure required for the method can be provided by any means. An exemplary system includes a digestion bomb (configured to contain high pressures) within a furnace or oven (configured to provide heat).

In one embodiment, heating the precursor solution to produce PZT nanoparticles includes at least the sequential steps of:

(i) heating the precursor solution at a first rate to a first temperature, wherein said first rate is between about 1° C./min and about 30° C./min, and wherein said first temperature is between about 120° C. and about 350° C.;

(ii) holding for a first hold time at the first temperature, wherein said first hold time is between about 5 and about 300 minutes; and (iii) cooling at a second rate to provide a nanoparticle PZT solution comprising a suspended plurality of perovskite PZT nanoparticles having a smallest dimension of between about 20 nm and about 1000 nm, wherein said second rate is between about 1° C./min and about 30° C./min.

The heating ramp rate ("first rate") is used to raise the temperature of the precursor solution from about room temperature ($T_{RT}$) to the maximum hydrothermal processing temperature ($T_{max}$). In one embodiment, the first rate is between about 1° C./min and about 30° C./min. In another embodiment, the first rate is greater than about 10° C./min.

The processing temperature ("first temperature"; $T_{max}$) is between about 120° C. and about 350° C. In certain embodiments, the first temperature is 200° C. or less. While the heating schedule is primarily described herein as including a single first temperature, to which the solution is heated, it will be appreciated that the present method contemplates variations in the first temperature that may arise from the hydrothermal reaction or inaccuracies in the heating equipment. Furthermore, the heating step of the heating schedule may include second, third, or further temperatures to which the heated precursor solution is subjected. The second, third, or further temperatures may be higher or lower than the first temperature, as required to produce the desired PZT nanoparticles.

In certain embodiments, the furnace is held at room temperature when the precursor solution is place inside to begin the heating cycle. However, cycling the furnace from room temperature, to the elevated first temperature, and back again to room temperature is not always necessary for formation of optimal PZT nanoparticles. Accordingly, the furnace may be maintained at an elevated temperature, such as the first temperature ($T_{max}$), and the precursor solution place in the heated furnace. In such a situation, the precursor solution still rises in temperature from room temperature to the first temperature, although the heating takes place at a higher rate than if the entire furnace is warmed from room temperature to the first temperature. Therefore, in certain embodiments, the step of heating the precursor solution at a first rate comprises placing the precursor solution into a furnace heated to the first temperature. This is referred to herein as an "expedited heating schedule" and is described further in Example 3. In such embodiments, the first rate is from 20 to 40° C./min. The expedited heating schedule improves single-batch processing time by eliminating the furnace ramp time, and also improves batch-to-batch processing time by eliminating the length heating and cooling times required for the furnace. Therefore, an essentially continuous processing can be achieved by adding a new batch of precursor solution to the oven when a completed batch is removed.

Figure 2:
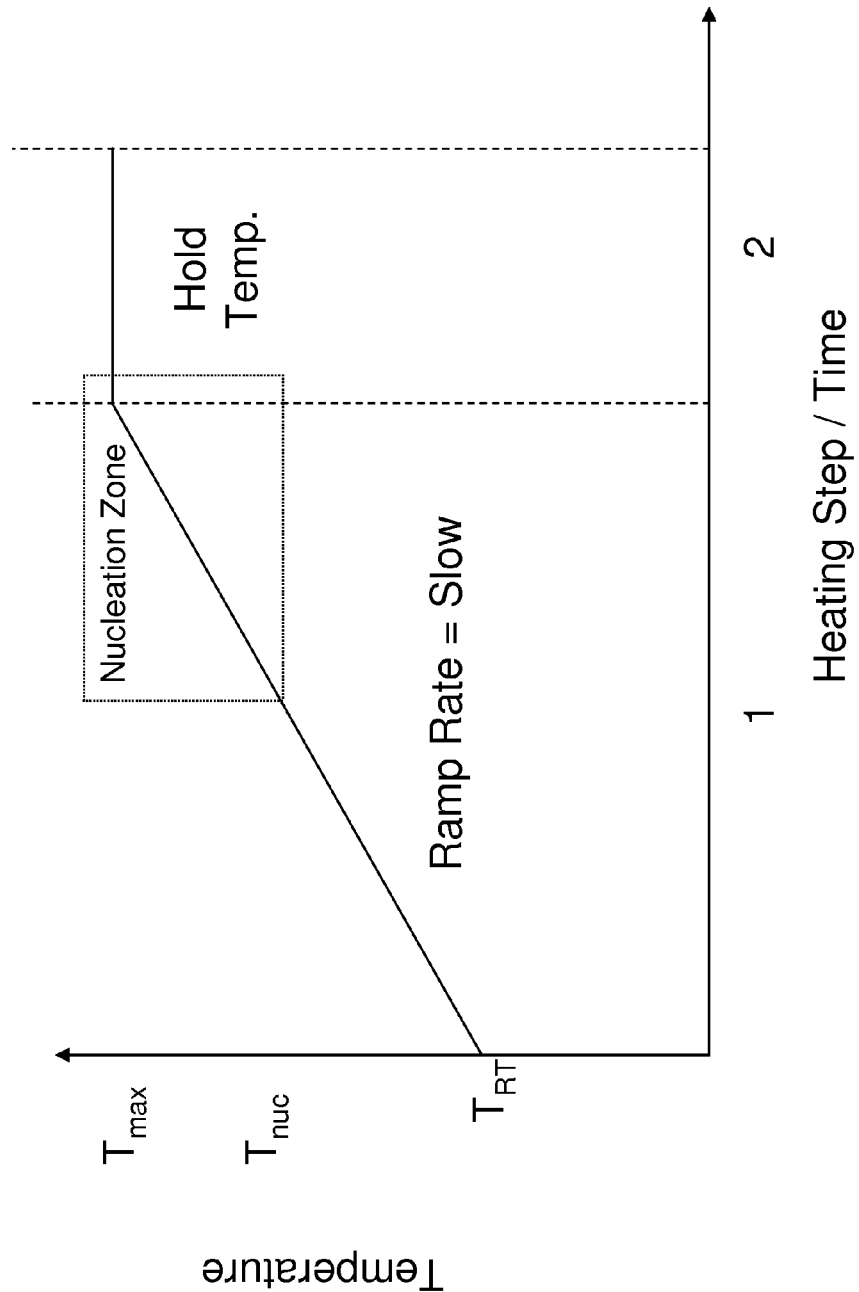
FIG. 2 illustrates a portion of a heating schedule, including a slow ramp rate, as used in the methods for forming lead zirconate titanate (PZT) nanoparticles in accordance with embodiments provided herein.
Figure 3:
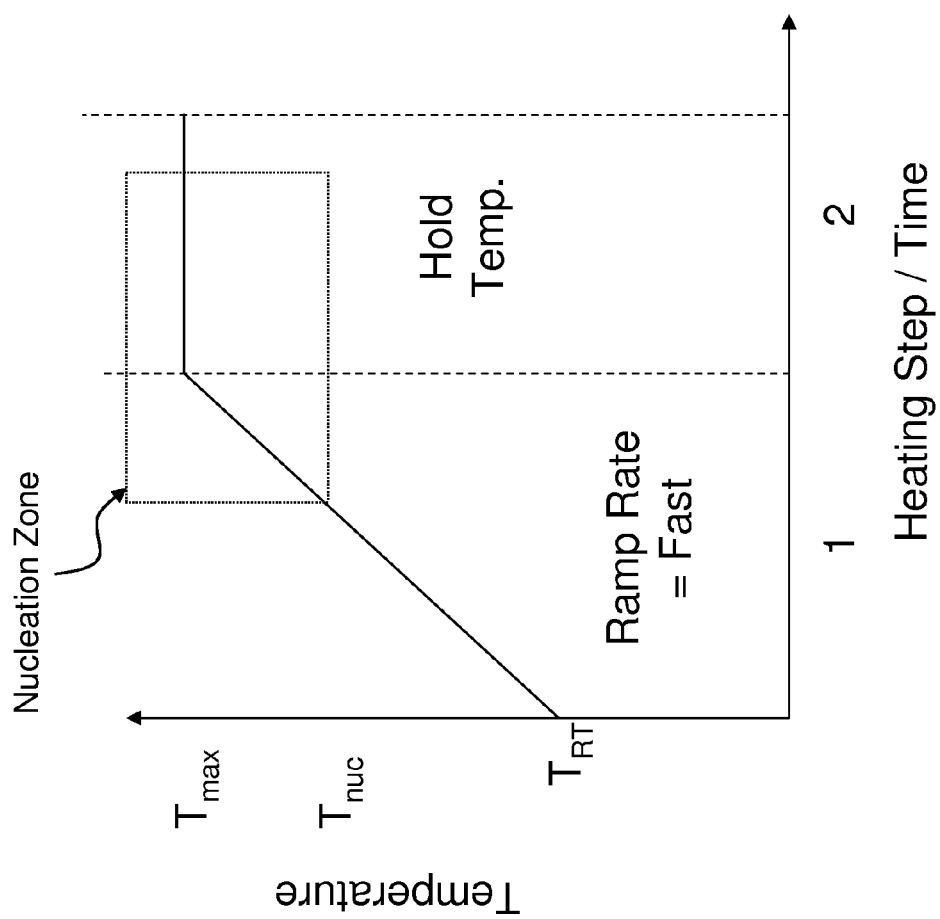
FIG. 3 illustrates a portion of a heating schedule, including a fast ramp rate, as used in the methods for forming PZT nanoparticles in accordance with embodiments provided herein.

The first rate is particularly important to control the size of the PZT nanoparticles produced. In this regard, referring to FIGS. 2 and 3, as the temperature of the precursor solution heats from $T_{RT}$ to $T_{max}$, there is an intermediate temperature, $T_{nuc}$, at which PZT crystals begin to nucleate. This "Nucleation Zone" is illustrated in FIGS. 2 and 3. Optimal PZT crystal growth occurs at $T_{max}$, and any crystals nucleated at a temperature lower than $T_{max}$ will likely grow larger, form larger aggregates, and will agglomerate more than PZT crystals nucleated at $T_{max}$.

A slow ramp rate, as illustrated in FIG. 2 results in a longer amount of time that the precursor solution spends between $T_{nuc}$ and $T_{max}$. Accordingly, a slow ramp rate results in more PZT crystal nucleation at temperatures below $T_{max}$, resulting in inconsistent PZT crystal size and crystal structure. As used herein, the term "slow ramp rate" refers to a ramp rate of below 1° C./min.

Conversely, a relatively fast ramp rate, as illustrated in FIG. 3, results in homogeneous PZT crystal nucleation by passing the precursor solution quickly through the temperature range between $T_{nuc}$ and $T_{max}$. As used herein, the term "fast ramp rate" refers to a ramp rate of 10° C./min or greater. In certain embodiments, the high ramp rate is a ramp rate of 30° C./min or greater.

As a result of the nucleation dynamics described above, the higher the ramp rate, the smaller the PZT particles generated.

While the heating ramp rate affects the size and number of PZT crystals, it does not affect the crystal structure. Similarly, the cooling rate does not affect the crystal structure.

The "hold" step of the heating schedule allows the PZT crystals time to form and grow. The hold step is between about 5 and about 300 minutes at the first temperature. Typically, a longer hold time results in larger crystals. If the hold step is too short, the PZT phase will not form.

After the hold step, the heating schedule proceeds to a "cooling" step. The cooling rate reduces the temperature from the maximum processing temperature to room temperature at a "second rate." In one embodiment, the cooling rate is greater than 1° C./min. In another embodiment, the cooling rate is from about 1° C./min to about 30° C./min.

With regard to forming quality PZT nanoparticles, the "initial cooling stage" is an important aspect of the method. As used herein, the term "initial cooling stage" refers to the period of cooling between the start of the cooling step and when the precursor solution reaches 100° C., as illustrated in FIG. 1. In one embodiment, the cooling rate in the initial cooling stage is greater than 1° C./min. In another embodiment, the cooling rate in the initial cooling stage is greater than about 10° C./min.

While the cooling rate illustrated in FIG. 1 is linear, it will be appreciated that the cooling rate need not be linear, and is typically exponential.

The cooling rate impacts several aspects of the PZT nanoparticles. The cooling rate can be controlled by modifying the temperature surrounding the precursor solution. For example, if the precursor solution is in a digestion bomb within a furnace for heating, the furnace can be turned off to produce a slow cooling rate, or the digestion bomb can be removed from the furnace and placed in a cool environment (e.g., an oil quenching bath) to provide a high cooling rate.

Figure 8A:
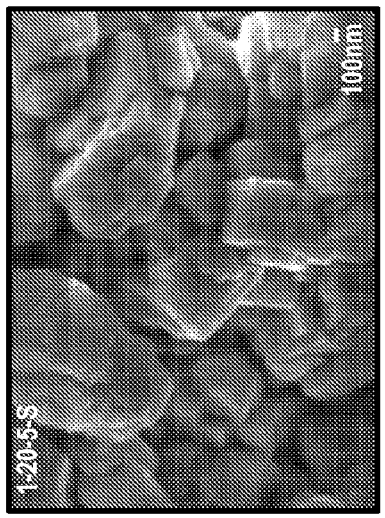
FIGS. 8A-8E are scanning electron micrographs of PZT nanoparticles formed in accordance with embodiments provided herein.
Figure 8B:
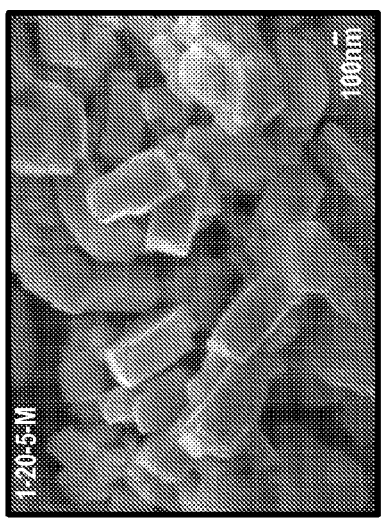
Figure 8C:
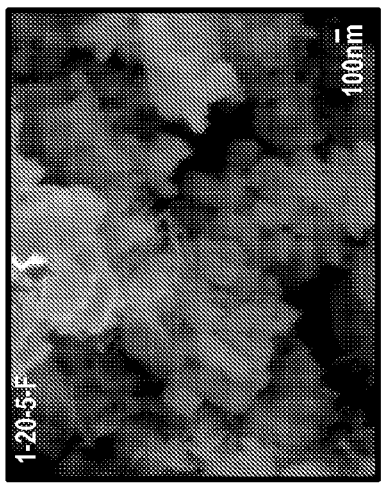
Figure 8D:
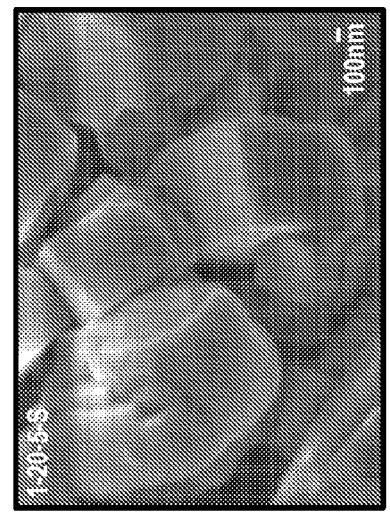
Figure 8E:
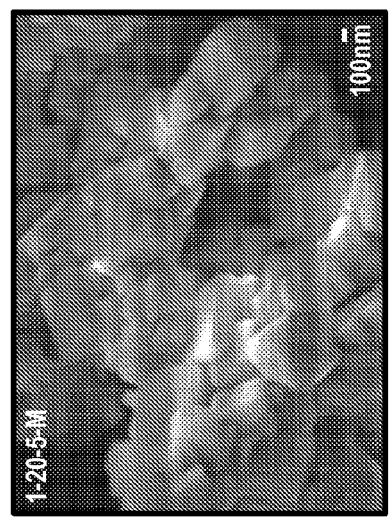
Figure 10A:
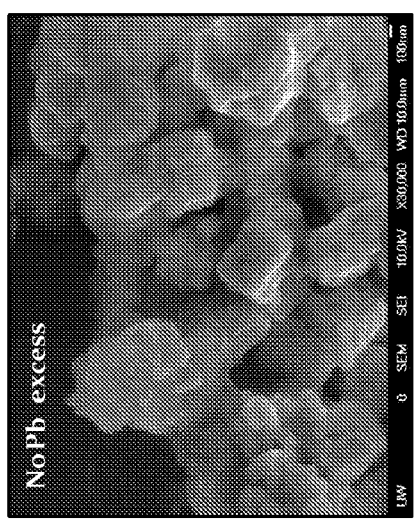
FIGS. 10A-10E are scanning electron micrographs of PZT nanoparticles formed using excess lead in accordance with embodiments provided herein.
Figure 10B:
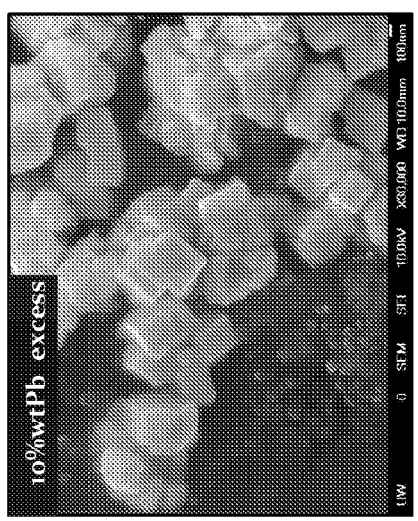
Figure 10C:
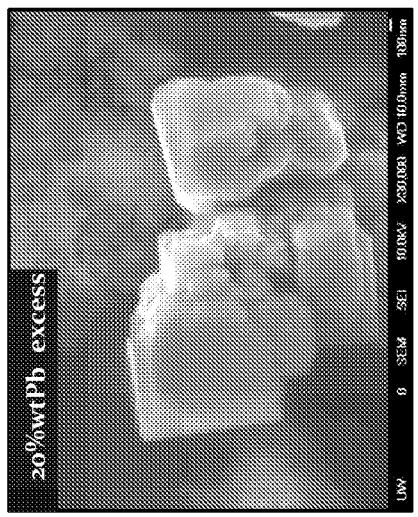
Figure 10D:
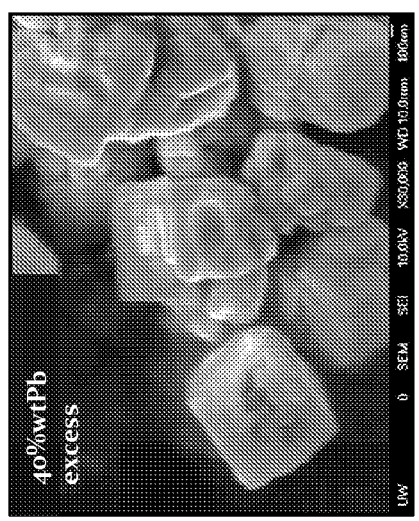
Figure 10E:
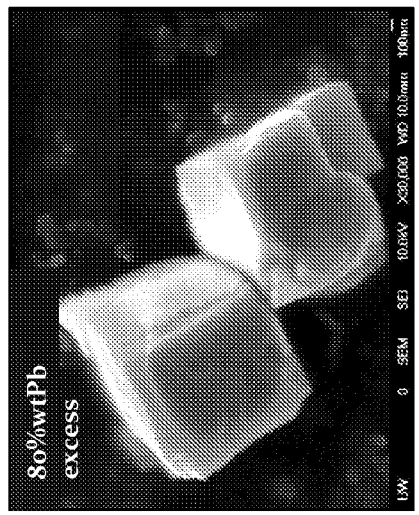

The cooling rate partially determines the morphology and size of the formed PZT nanoparticles. As described in further detail in Example 1, a relatively fast cooling rate, for example, a cooling rate of greater than 20° C. per minute, results in PZT nanoparticles in the range of 100 nm to 500 nm and a distinct cubic shape, as illustrated in FIG. 8C.

Additionally, a relatively fast cooling rate results in PZT nanoparticles that are physically bonded, as opposed to chemically bonded. Physically bonded PZT nanoparticles are preferable to those that are chemically bonded because separation of physically bonded nanoparticles is accomplished more readily than the separation of chemically bonded nanoparticles (e.g., by mechanical agitation).

Finally, a faster cooling rate minimizes the presence of $PbTiO_3$ phase in the final product. This is desirable because $PbTiO_3$ not only is an impurity that must be removed to obtain pure PZT nanoparticles, but forming $PbTiO_3$ also reduces the yield of the PZT-formation reaction by consuming lead and titanium in a form other than PZT.

In certain embodiments, the second rate is sufficiently large that PZT particles are formed that are non-perovskite forms of PZT. In this regard, in certain embodiments, the method further comprises a step of treating the nanoparticle PZT solution to eliminate the non-perovskite forms of PZT. Such a treatment may include chemically-assisted dissolution, wet etching, acid washing, base washing, and combinations thereof. Any method that selectively eliminates (e.g., dissolves) the non-perovskite PZT can be used. For example, a dilute acetic acid wash can be used to eliminate the $PbTiO_3$ non-perovskite component of the PZT hydrothermal synthesis.

Alternatively, instead of eliminating the non-perovskite PZT particles, in certain embodiments, the method further includes a step of separating the perovskite PZT nanoparticles from the non-perovskite forms of PZT in the nanoparticle PZT solution. In this additional step, the end suspension is washed with DI water, diluted acid, or ethanol to remove the non-perovskite forms.

In certain embodiments, the second rate is sufficiently large that the nanoparticle PZT solution becomes supersaturated. In this regard, nucleation and crystal growth proceeds when the solution is supersaturated and then stops when the concentration reaches an equilibrium. For all temperatures, there is a equilibrium concentration that halts crystal growth. Therefore, when the second rate is slow, the solution can be supersaturated multiple times and the crystal has more chances to grow larger. Conversely, for a fast second rate, the solution does not have time to reach equilibrium, which promotes further nucleation to occur along with crystal growth. The nucleation rate is high when the concentration is high so both nucleation and growth are rapid. Because of this effect, the secondary nucleation and growth will not form stable crystals or will create amorphous materials, both of which are undesirable. Preferably, nucleation only occurs during at the end of the heating ramp and during the hold time.

As will be explained in further detail in Example 1, the route to forming the smallest and highest quality PZT nanoparticles is achieved using the shortest possible processing time for the hydrothermal processing, which includes using the highest heating ramp rate, the fastest cooling ramp rate, and a mineraliser concentration that facilitates quality PZT formation. The ideal mineraliser concentration affects the processing time. For example, in an exemplary system, if 5M mineraliser is used, the processing time can be as short as 1 hour but for 2M mineraliser, the required processing time is 3 hours. Additionally, if the mineraliser concentration is not sufficient, no PZT will form, no matter how long the processing time. For example, if the mineraliser concentration is lower than 0.4M, no PZT will be formed regardless of the processing time.

After the cooling step, a PZT nanoparticle solution is obtained. The PZT nanoparticle solution contains a plurality of PZT nanoparticles suspended in water. The PZT nanoparticle solution can be filtered or otherwise manipulated to isolate the PZT nanoparticles. Depending on the efficiency of the hydrothermal process, the solution may also contain $PbTiO_3$, $PbZrO3$, $PbO$, $TiO2$, $ZrO2$, and $KOH$. Washing the solution with acetic acid is one method for removing PbO.

The PZT nanoparticles can be used for any application for which traditionally-formed PZT is used, as known to those of skill in the art. For example, the PZT nanoparticles can be used as a piezoelectric material when integrated with appropriate electrodes, as known to those of skill in the art.

Furthermore, the formed PZT nanoparticles may also enable applications for which traditional PZT cannot be used. For example, the PZT nanoparticles can be added as a guest to a host matrix to form a composite that can be applied conformally to a surface as a piezoelectric material. In such a "guest-host" application, the PZT nanoparticles can be incorporated, for example, into a silica precursor solution that is then spray-coated onto a surface to provide a PZT-silica composite film having piezoelectric properties. Because such a film can be spray coated, composite can be deposited conformally on non-planar surface.

The following examples are provided for the purpose of illustrating, not limiting, the methods described herein.

EXAMPLES

Example 1

Synthesis of PZT Nanoparticles

As a first step, $Ti(OCH(CH_3)_2)_4$ (tetra-iso-propyltitanate, "TIPT") was mixed with acetylacetone ("AcAc") in a molar ratio of 2 AcAc to 1 TIPT (e.g., 2.860 mL of TIPT and 1.960 mL of AcAc) to stabilize the TIPT. The mixture was continuously stirred under room temperature for 4 hours, and zirconium acetate, $Zr[O(CH_2)_2CH_3]_4$ (4.660 mL) was added after stirring. Next, the mixture of Ti and Zr sources was added dropwise into a 1 M aqueous potassium hydroxide (KOH) solution. White precipitate was formed during this process. Centrifugation was used to separate the white precipitate from the residual KOH solution. The precipitate was washed with DI water until it was pH neutral. The white precipitate (in the form of gel) was then mixed with lead acetate trihydrate, $Pb(C_2H_3O_2)_2$ powder (1.4210 g). Next, the mixture was added into a second aqueous KOH solution (serving as a mineraliser), whose concentration was varied to control the properties of the resulting PZT nanoparticles.

After all chemicals were mixed, the precursor solution was sealed in an autoclave and subjected to hydrothermal processing in a furnace at 200° C. and 15.549 bar.

During the hydrothermal process, various combinations of ramping rate, processing time and cooling time were used to obtain a suspension with PZT nanoparticles.

Finally, the suspension was centrifuged, washed until the pH was neutral, and then the PZT particles were furnace dried for evaluation, such as by scanning electron microscopy (SEM) and x-ray diffraction (XRD).

The experiments were repeated with some parameters always being fixed, while others varied from trial to trial. The fixed parameters include (a) molar ratio of each chemical (except the mineraliser) (molar ratio Pb:Ti:Zr=1:0.48:0.52) and (b) the amount of the PZT precursor injected in the autoclave and the furnace during the hydrothermal growth (10 mL of precursor injected into a 20 mL autoclave).

The following parameters were varied during the trials. First, the mineraliser concentration used was 0.4 M, 1 M, 5 M, and 10 M. Second, the heating ramp rate was 3° C./min, 10° C./min, or 20° C./min. Third, the hydrothermal processing time was 1 hour, 3 hours, 5 hours, 8 hours, and or 15 hours. Finally, three cooling rates are employed: slow, medium, and fast. For the slow cooling rate, the autoclave is cooled down in the furnace with the furnace door closed; the slow cooling rate is about 1.6° C./min. For the medium cooling rate, the autoclave was first kept in the closed furnace for some time and the furnace door was later opened to expedite the cooling; the medium cooling rate is from about 1.6° C./min to 6.7° C./min. For the fast cooling rate, the furnace door was opened right after the hydrothermal process is completed; the fast cooling rate is above 10° C./min.

Table 1 summarizes the controlled factors in all trials.

TABLE 1

Conditions for Trials A-F

| Trial | Sample # | Process time (hr) | Ramp rate (° C./min) | Mineraliser Concentration (M) | Cooling Rate |
|---|---|---|---|---|---|
| A | 1 | 3 | 3 | 0.4 | Slow |
|   | 2 | 5 |   |   |   |
|   | 3 | 8 |   |   |   |
|   | 4 | 15 |   |   |   |
| B | 1 | 3 | 3 | 1 | Slow |
|   | 2 | 8 |   |   |   |
| C | 1 | 5 | 10 | 5 | Slow |
|   | 2 | 5 |   | 10 |   |
|   | 3 | 10 |   | 5 |   |
|   | 4 | 10 |   | 10 |   |
|   | 5 | 1 | 20 | 5 | Slow |
|   | 6 | 1 |   | 10 |   |
|   | 7 | 5 |   | 5 |   |
|   | 8 | 5 |   | 10 |   |
|   | 9 | 10 |   | 5 |   |
|   | 10 | 10 |   | 10 |   |
| D | 1 | 1 | 20 | 5 | Slow |
|   | 2 |   |   |   |   |
|   | 3 |   |   |   | Fast |
|   | 4 |   |   |   |   |
|   | 5 |   |   |   |   |
| E | 1~5 | 1 | 20 | 5 | Medium |
|   | 6~10 |   |   |   | Fast |
| F | 1~8 | 1 | 20 | 5 | Fast |

The PZT powders were evaluated with X-ray diffraction (XRD) and scanning electron microscopy (SEM). XRD can not only identify existence of PZT, but also provide information about crystallinity and size of smallest repeatable crystal cell of PZT. SEM reveals morphology and size of the PZT particles. The data and relevant FIGURES refer to samples labeled with the following convention:

Trial (a letter)-processing time (hour)-ramping rate (° C./min)-mineraliser concentration (M)-cooling rate (S/M/F).

Figure 4:
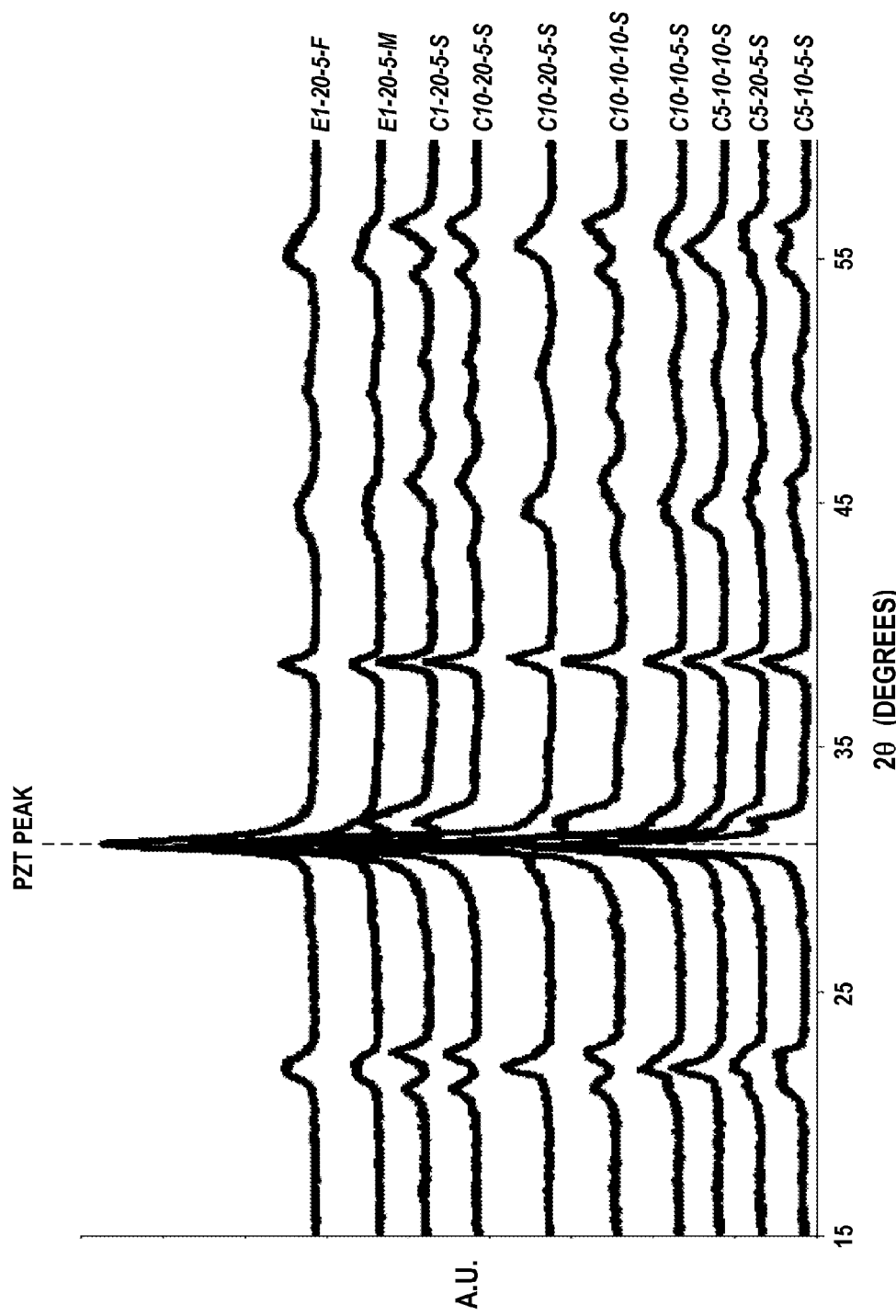
FIG. 4 graphically illustrates x-ray diffraction data obtained from PZT nanoparticles formed in accordance with embodiments provided herein.
Figure 5A:
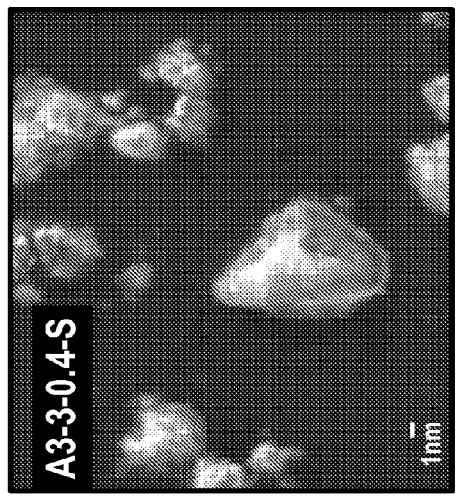
FIGS. 5A-5D are scanning electron micrographs of PZT nanoparticles formed in accordance with embodiments provided herein.
Figure 5B:
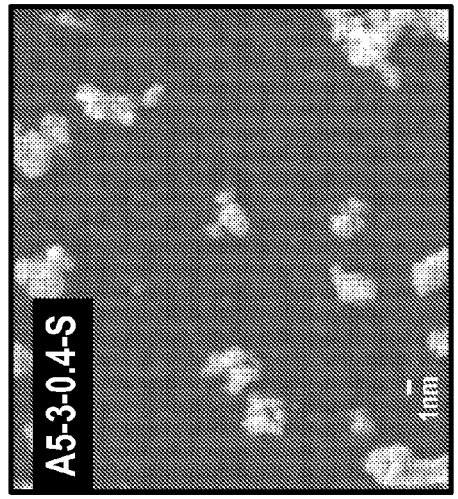
Figure 5C:
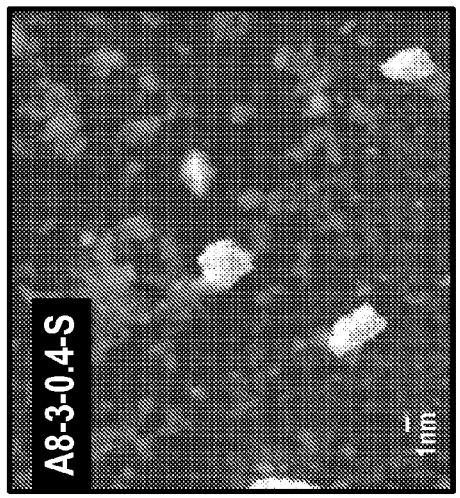
Figure 5D:
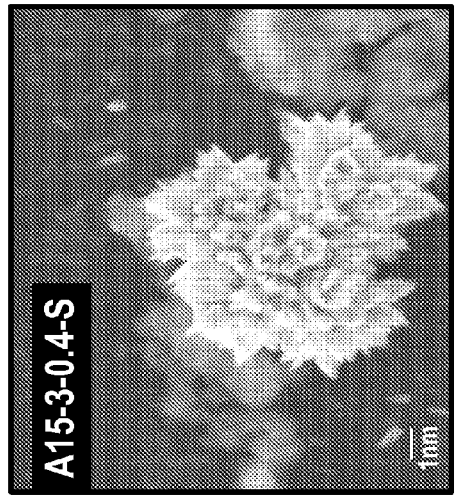
Figure 6B:
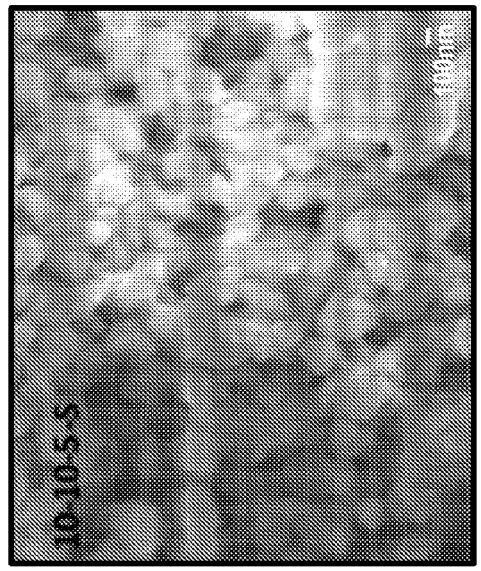
FIGS. 6A-6D are scanning electron micrographs of PZT nanoparticles formed in accordance with embodiments provided herein.
Figure 6D:
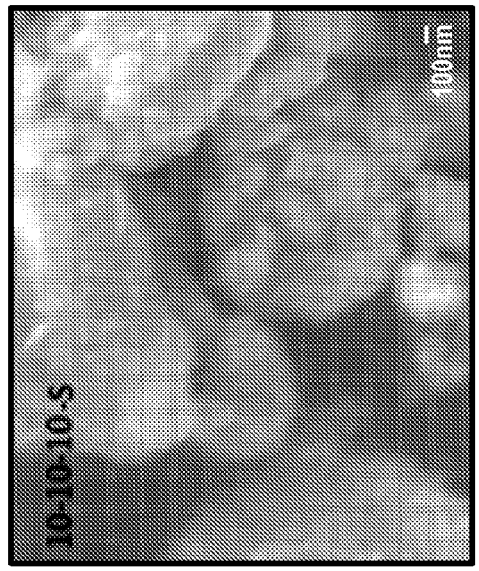
Figure 6A:
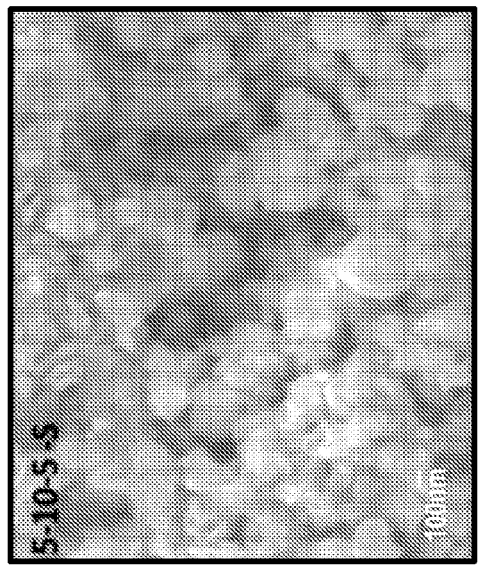
Figure 6C:
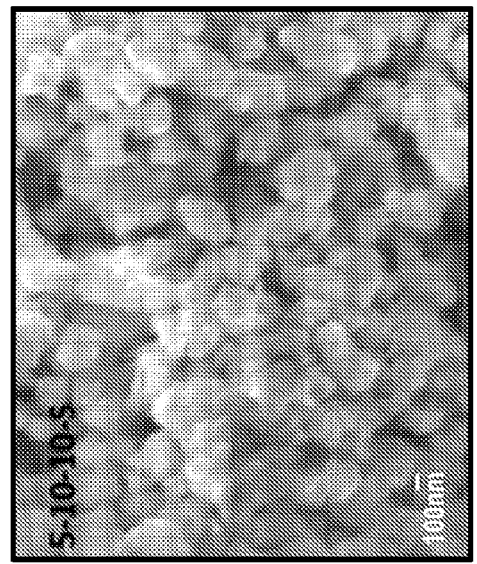
Figure 7A:
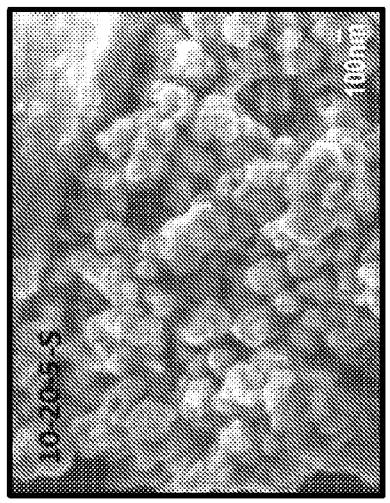
FIGS. 7A-7F are scanning electron micrographs of PZT nanoparticles formed in accordance with embodiments provided herein.
Figure 7B:
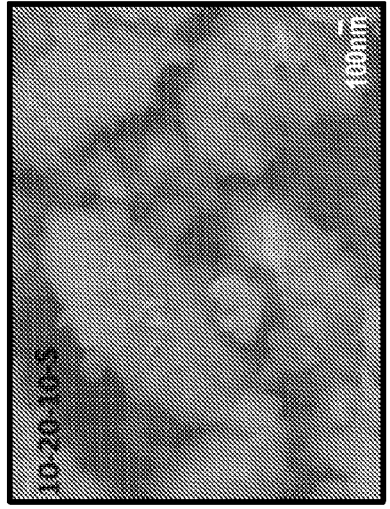
Figure 7C:
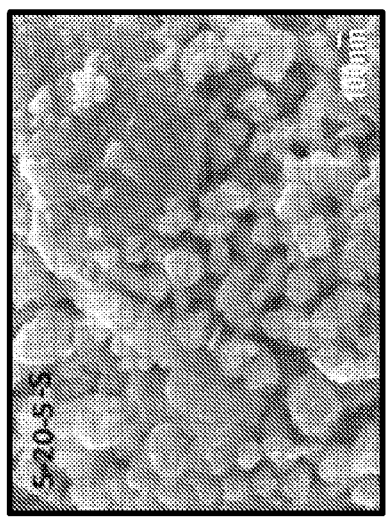
Figure 7D:
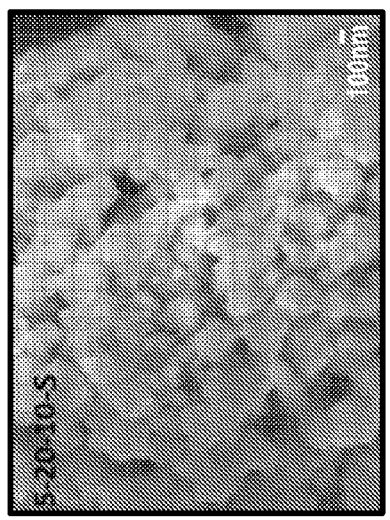
Figure 7E:
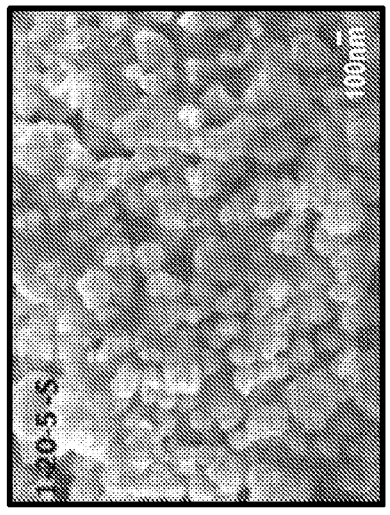
Figure 7F:
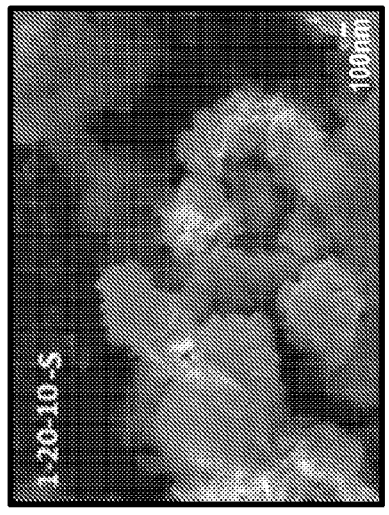

FIG. 4 shows XRD patterns from various trials. The figure consists of various processing times, ramping rates, mineraliser concentrations, and cooling rates. PZT peaks have high intensity in each of the XRD patterns of FIG. 4, which indicates the presence of crystalline PZT.

In FIG. 4, impurities are also present in certain samples. For example, the slowly cooled samples include the PbTiO3 phase in addition to PZT. For example, FIG. 4 includes XRD patterns from Trial C, which consists of short processing time, higher ramping, higher mineraliser concentration, and slow cooling rate. Samples with 5M mineraliser concentration all show PbTiO3 phase, regardless of the processing time and ramping rate.

In contrast, Trials D and E consist of short processing time, high ramping rate, medium mineraliser concentration (5 M), and various cooling rates. These two trials were designed as repeating samples to confirm the results. FIG. 4 includes XRD patterns from trial E, with medium and fast cooling rates. Both patterns imply acceptable crystallinity of PZT. The results from trial E also indicate that the degree of peak shift is independent of the cooling rate. Finally, these results indicate that faster cooling minimizes the presence of the $PbTiO_3$ phase.

SEM images of Trials A, C, D, E, and F are discussed below. Trials with similar conditions are placed together for comparison.

FIGS. 5A-5D show SEM images of Trial A. With "slow" ramping rate and low mineraliser concentration, all particles are larger than 1 μm. In general, the degree of aggregation and size of the crystal increase with the processing time. For the sample of 15-hour processing time (FIG. 5D), a larger cluster of small crystals is shown in the SEM images.

FIGS. 6A-6D show SEM images from Trial C, with a "medium" ramping rate of 10° C./min. All SEM images have the same magnification of 30,000. In general, all samples with a 5M mineraliser concentration have particle size in the range of 200 nm to 600 nm. The processing time does not affect the size of the crystal significantly. When the mineraliser concentration is increased to 10M, longer processing time results in larger crystals. When the processing time is less than 5 hours, the mineraliser concentration does not affect the crystal size.

FIGS. 7A-7F show SEM images from Trial C, with a "fast" ramping rate of 20° C./min. Again, samples with 5M mineraliser concentration show consistent crystal size regardless of the processing time. Similarly, increase of mineraliser concentration promotes larger particle size.

According to Trial C, the highest ramping rate (20° C./min) and the medium mineraliser concentration (5 M) produce the smallest particle size. Therefore, we use these parameters along with a short processing time (1 hour) as a reference configuration for subsequent Trials D, E, and F, in which effects of cooling rates are studied.

FIGS. 8A-8E show SEM images from Trials D, E, and F. The effect of cooling rate is explored in FIGS. 8A-8E. A "slow" cooling rate of about 1.6° C./min was used to generate the samples of FIGS. 8A and 8D; a "medium" cooling rate of about 1.6° C./min to 6.7° C./min was used to generate the samples of FIGS. 8B and 8E; and a "fast" cooling rate of above 10° C./min was used to generate the sample in FIG. 8C. The slow and medium cooling rates produce larger crystal in the range of 300 nm to 800 nm. Moreover, some slow and medium samples show crystals that are chemically bonded increasing overall particle size. In contrast, the fast cooling rate (FIG. 8C) leads to the best morphology. The crystal shape is uniform and the crystal structure can be seen clearly. The fast cooling rate results in smaller crystals in the range of 100 nm to 500 nm. Moreover, any crystals that are bonded to other crystals are physically bonded, instead of chemically bonded, as was seen in other samples in this example. This distinction is important because physically bound crystals are relatively easily separated (e.g., by grinding or sonication), whereas chemically separated crystals are more difficult to separate (e.g., by chemical or electrochemical etching).

Overall, a combination of short processing time (1 hour), highest ramping rate (20° C./min), medium mineraliser concentration (5 M), and fast cooling rate provides the smallest and best-formed PZT nanoparticles.

PZT nanoparticles were fabricated through use of hydrothermal process by careful controlling four process parameters. Ramping and cooling rates are two important parameters for controlling size and morphology. Mineraliser concentration, if properly selected, cannot only stabilize particle size, but also minimize effects of processing time on the particle size. Processing time should be reduced to ensure that the particle size is within the acceptable range. Overall, the best parameter configuration for the samples tested in this example, consists of short processing time (1 hour), highest ramping rate (20° C./min), medium mineraliser concentration (5M) and fast cooling rate. Under these conditions, PZT nanoparticles with a size of less than 600 nm can be produced with superior morphology and crystallinity.

Example 2

Synthesis of PZT Nanoparticles Using Excess Lead

The addition of excess lead in the precursor solution was investigated as a means of controlling the size, morphology, and other features of PZT crystals.

In this example, the reaction conditions were essentially the same as described in Example 1. The primary difference is that greater than 1 weight equivalent of the source of lead, $Pb(C_2H_3O_2)_2$, was used. The amount of excess lead was varied in order to test the effect of excess lead. In the results provided herein, the amount of excess lead is listed as a percentage, with 0% being no excess lead (i.e., 1 weight equivalent of the source of lead), and 100% being two weight equivalents of the source of lead. For example, if no excess lead is 5 g of $Pb(C_2H_3O_2)_2$, an 80% excess of lead would result from 9 g of $Pb(C_2H_3O_2)_2$.

Both 1 M and 2 M aqueous KOH mineraliser concentrations were used.

The hydrothermal conditions were 3 hours at 200° C., with 20° C./min ramping rate, and the fastest cooling rate of above 10° C./min.

After the PZT was formed, the powder was washed with diluted acetic acid (10% vol.) to remove the lead oxide generated by the excess lead.

It was determined that when excess lead is used, the resulting (pre-acid wash) powder is pink or yellow suspension, as opposed to white for a more pure PZT suspension. The color is attributed to a lead oxide. The suspension turns white after washing with dilute acetic acid to remove the lead oxide. While the lead oxide is an unwanted byproduct of the excess lead technique, the relatively easy step of an acid wash removes the lead oxide.

It was determined that excess lead in the precursor solution requires a longer hydrothermal processing time to form the PZT. For example, 5M mineraliser, 1 hr sample failed to have PZT composition even with only 10% wt excess lead.

Regarding mineraliser concentration, 1 M mineraliser concentration results in two distinct morphologies: amorphous and non-detectably small crystals.

Furthermore, the 1 M samples failed to form PZT when the excess lead is above 10%. Accordingly, the results presented herein were obtained using 2 M mineraliser.

When compared to no excess lead (i.e., 0% excess lead), the excess lead: reduces the amount of amorphous material in the PZT suspension; the PZT particles are less agglomerated; the PZT particles are less chemically bonded into aggregates; the PZT particles have improved morphology (e.g., more individual crystals, a sharper cubic structure, and well-developed facets); the PZT particle size increases as the amount of excess lead increases; and the final suspension still contains both a $PbZrO_3$ phase and a $PbTiO_3$, in addition to PZT.

For the excess Pb trial, increasing the percentage of excess lead can significantly reduce amorphous phase. Also, all samples with excess lead show less agglomeration, fewer large (i.e., greater than one micron) chemically bonded aggregates, better morphology. However, as percentage of excess lead increases, the particle size increases as well. The sample without excess lead and 10 wt. % excess sample have particle size about 200 nm. The 20 wt. % and 40 wt. % excess samples have particle size about 400 nm. The 80 wt. % excess sample has particle size around 600 nm. FIGS. 9A-9E (10,000×) and FIGS. 10A-10E (30,000×) are SEM micrographs of PZT nanoparticles formed using various amounts of excess lead in the precursor solution.

Example 3

High-Volume Synthesis of PZT Nanoparticles

The objective of the present description is to provide an improved production process for PZT nanoparticles of the quality demonstrated in Example 2, such that higher volumes of quality PZT nanoparticles can be synthesized. Obtaining large amounts of PZT nanoparticles is desirable in order to continue development of products containing the PZT nanoparticles, such as PZT ink. It would take a tremendous amount of time to prepare the desired amount of PZT nanoparticles required for such development activities using the processes described above in Examples 1 and 2.

The recipe for forming PZT nanoparticles disclosed in Example 2 uses excess lead (e.g., 80%) and relatively low KOH mineraliser concentration (2.5M). The hydrothermal process includes a relatively high ramping rate of about 20° C./min, a set temperature 200° C., a process of 2.5 hours, and fast cooling rate (i.e., cooling at room temperature). This recipe produces a desirable PZT nanoparticle product that includes a reduced amorphous phase and degree of agglomeration while maintaining desirable morphology and correct chemical composition. This recipe, however, requires a process time on the order of several hours.

The temperature ramp-up of the furnace from room temperature to the hold temperature (FIG. 1) has been identified as a step in the recipe that can be expedited. Particularly inefficient is the cooling of the furnace to room temperature after completion of a synthesis cycle.

Synthesis of PZT Nanoparticles

In an effort to improve upon the processes of Examples 1 and 2, the Example 2 synthesis was modified as follows. As a first step, tetra-iso-propyltitanate, $Ti(OCH(CH_3)_2)_4$ 2.5 mL ("TIPT") was mixed with acetylacetone 1.2 mL ("AcAc"). The mixture was continuously stirred under room temperature for 4 hours, and 4.8 mL of zirconium acetate, $Zr[O(CH_2)_2CH_3]_4$ was added after stirring. Next, the mixture of Ti and Zr sources was dropped into a 1 M potassium hydroxide (KOH) solution. White precipitate (zirconium titanium oxide) was formed during this process. Centrifuge was used to separate the /white precipitate from the residual KOH solution. The precipitate was washed with DI water until pH neutral. The white precipitate (in the form of gel) was then mixed with lead acetate trihydrate, 5 g $Pb(C_2H_3O_2)_2$. The amount of lead acetate trihydrate is 50% (wt) more than required (i.e., excess lead). Next, the mixture was added into a second KOH solution (serving as a mineraliser) with a concentration of in range of 2.75 M to 3.5 M. The primary difference in the present precursor solution compared to Example 2 is 50% excess lead in this example compared to 80% excess lead in Example 2.

We also modify the hydrothermal process to scale up the production as follows. First, the furnace was maintained at the hydrothermal processing temperature (i.e., 200° C.) to eliminate ramping and cooling. After all the chemicals were well mixed in the mineraliser, it was sealed in an autoclave (containing 10 mL of PZT precursor) at the room temperature. The autoclave was then placed in the furnace directly. The approximate ramping rate is 20° C./min to 40° C./min once the autoclave is placed in the furnace. After 2 hours of hydrothermal growth, the autoclave was taken out of the furnace and cooled to room temperature to obtain suspension with PZT nanoparticles. The hydrothermal growth time is reduced (compared to Example 2) as a result of increased concentration of the mineraliser. Because the present process eliminates furnace ramping, up to three hours in processing time per batch of PZT nanoparticles is saved. The result is that the production rate is essentially tripled.

Finally, the suspension from the autoclave was centrifuged, washed with diluted acetic acid to remove un-reacted lead, washed with DI water until the pH was neutral, and then the PZT particles were furnace-dried for evaluation, such as by SEM and/or XRD.

This method leads to PZT nanoparticles with the desired (i.e., identical to Example 2) morphology, chemical composition, and size distribution (e.g., 400-800 nm).

Characterization of Nanoparticles

Compared with the recipe from Example 2, three parameters are changed: amount of excess lead, concentration of mineraliser, and ramping. According to Example 2, increase in mineraliser could promote amorphous region and lower percentage of excess lead could increase agglomeration. Also, effects of eliminating the ramping are unknown. Therefore, we needed to ensure that these changes do not significantly affect morphology, particle size, crystal structure, and chemical composition.

Figure 11B:
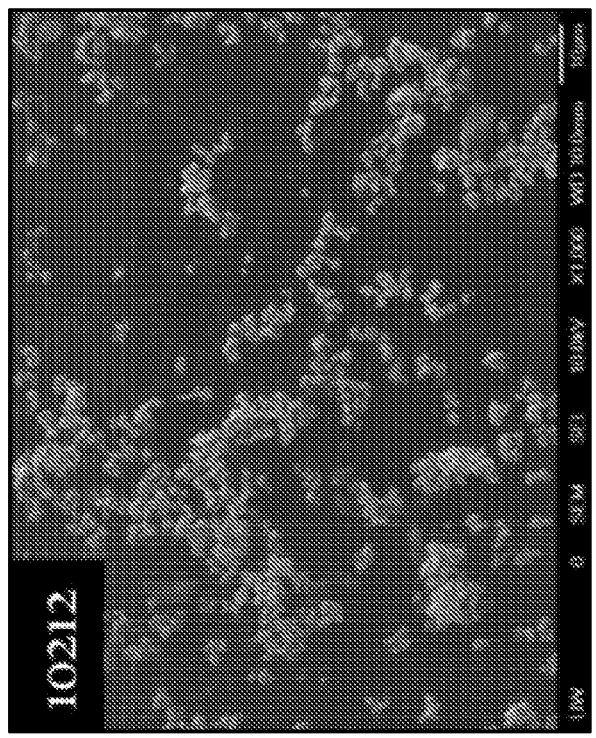
FIGS. 11A and 11B are scanning electron micrographs of PZT nanoparticles formed in accordance with embodiments provided herein.
Figure 11A:
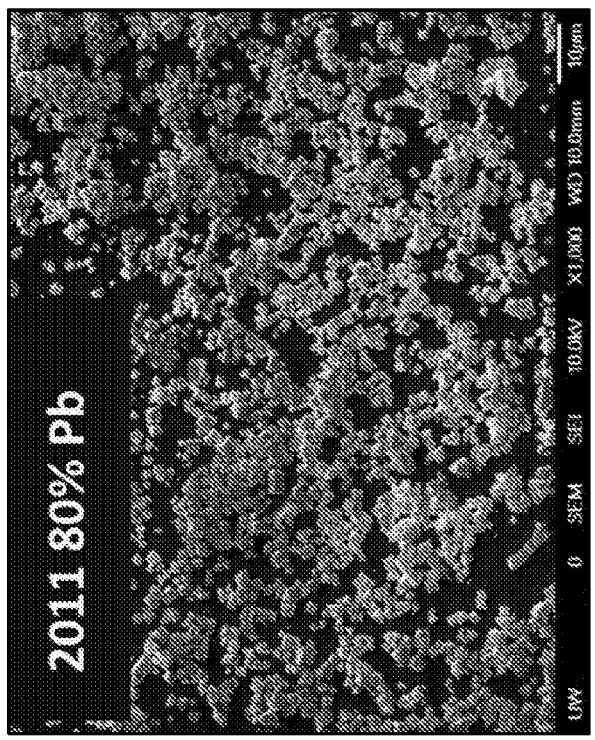

FIG. 11A is a 1,000×SEM micrograph of PZT nanoparticles formed in accordance with Example 2, using 80% excess lead, 2.5M KOH mineraliser concentration, and furnace ramping (heating and cooling).

FIG. 11B is a comparative 1,000×SEM micrograph that shows the morphology of PZT nanoparticles formed using the improved method disclosed in this example (i.e., 2.75-3.5M mineraliser, 50% excess lead, and no ramping). According to FIG. 11B, slight modification of the recipe did not create a large variation in the PZT nanoparticles. That is, the PZT nanoparticles do not contain significant amount of amorphous regions (amorphous regions would appear in lighter color with a cloudy appearance because they do not have defined shape).

Figure 12B:
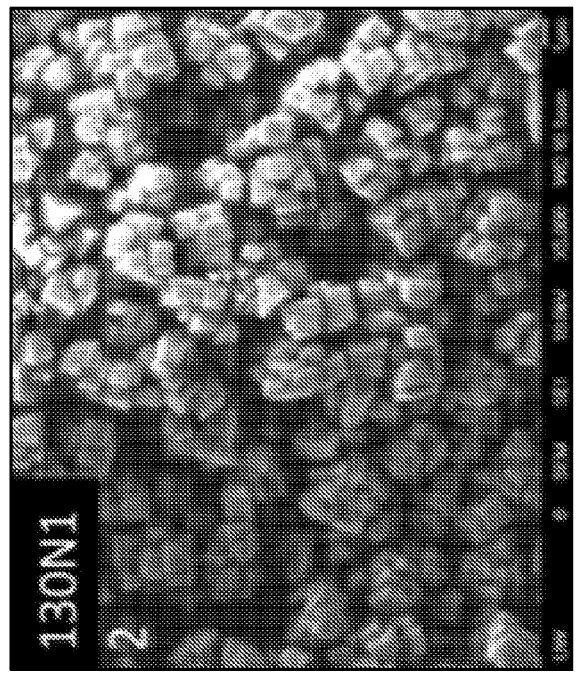
FIGS. 12A and 12B are scanning electron micrographs of PZT nanoparticles formed in accordance with embodiments provided herein.
Figure 12A:
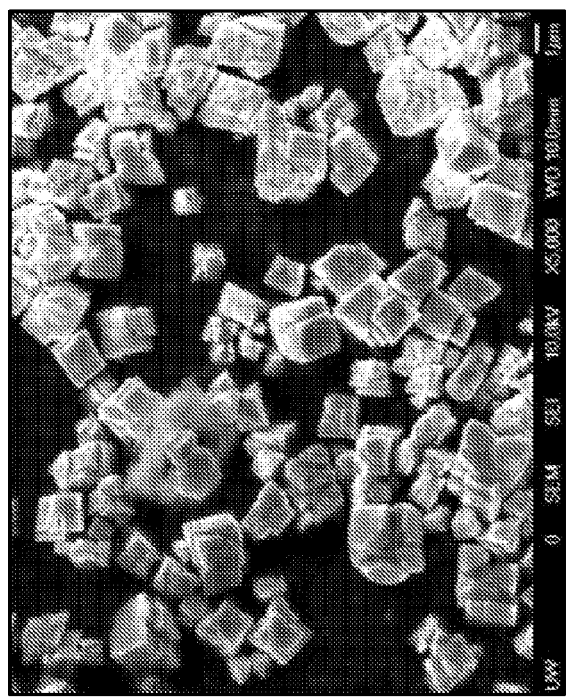
Figure 13B:
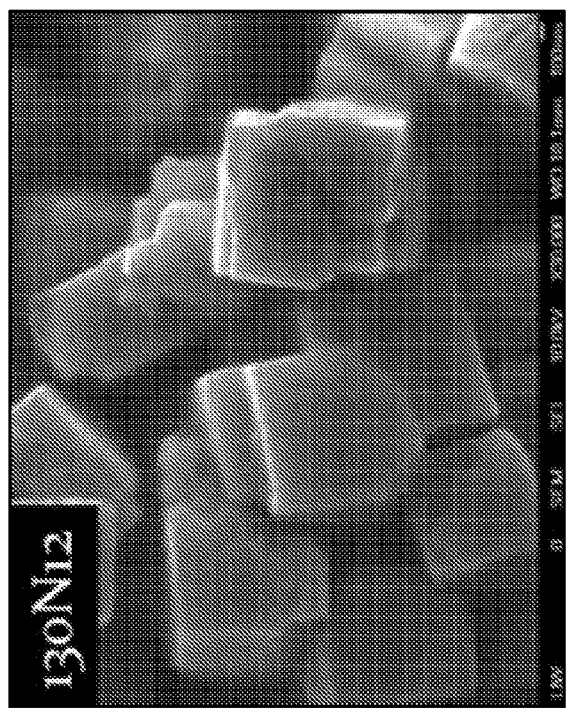
FIGS. 13A and 13B are scanning electron micrographs of PZT nanoparticles formed in accordance with embodiments provided herein.
Figure 13A:
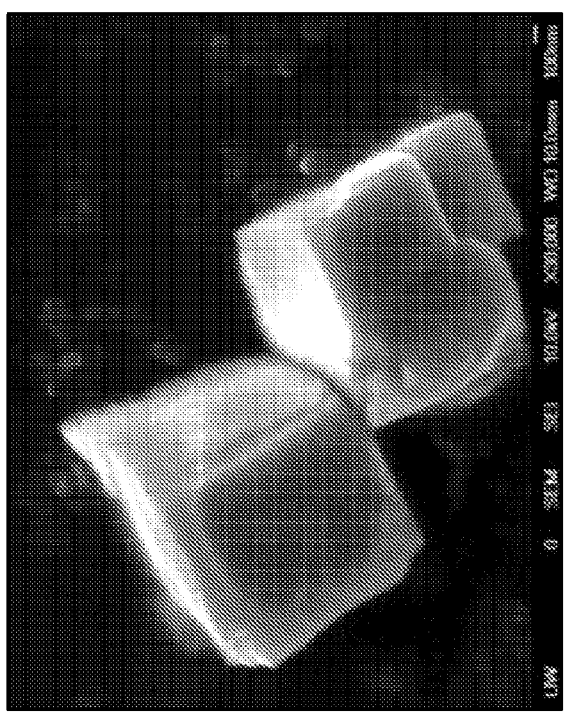

FIGS. 12A and 12B, as well as FIGS. 13A and 13B are similar comparisons as that of FIGS. 11A and 11B, although at different magnifications. FIG. 12A (Example 2 method) and FIG. 12B (present method) are taken at a magnification of 5,000×. FIG. 13A (Example 2 method) and FIG. 13B (present method) are taken at a magnification of 30,000×.

The PZT nanoparticles formed by both methods appear essentially identical by SEM.

Figure 14:
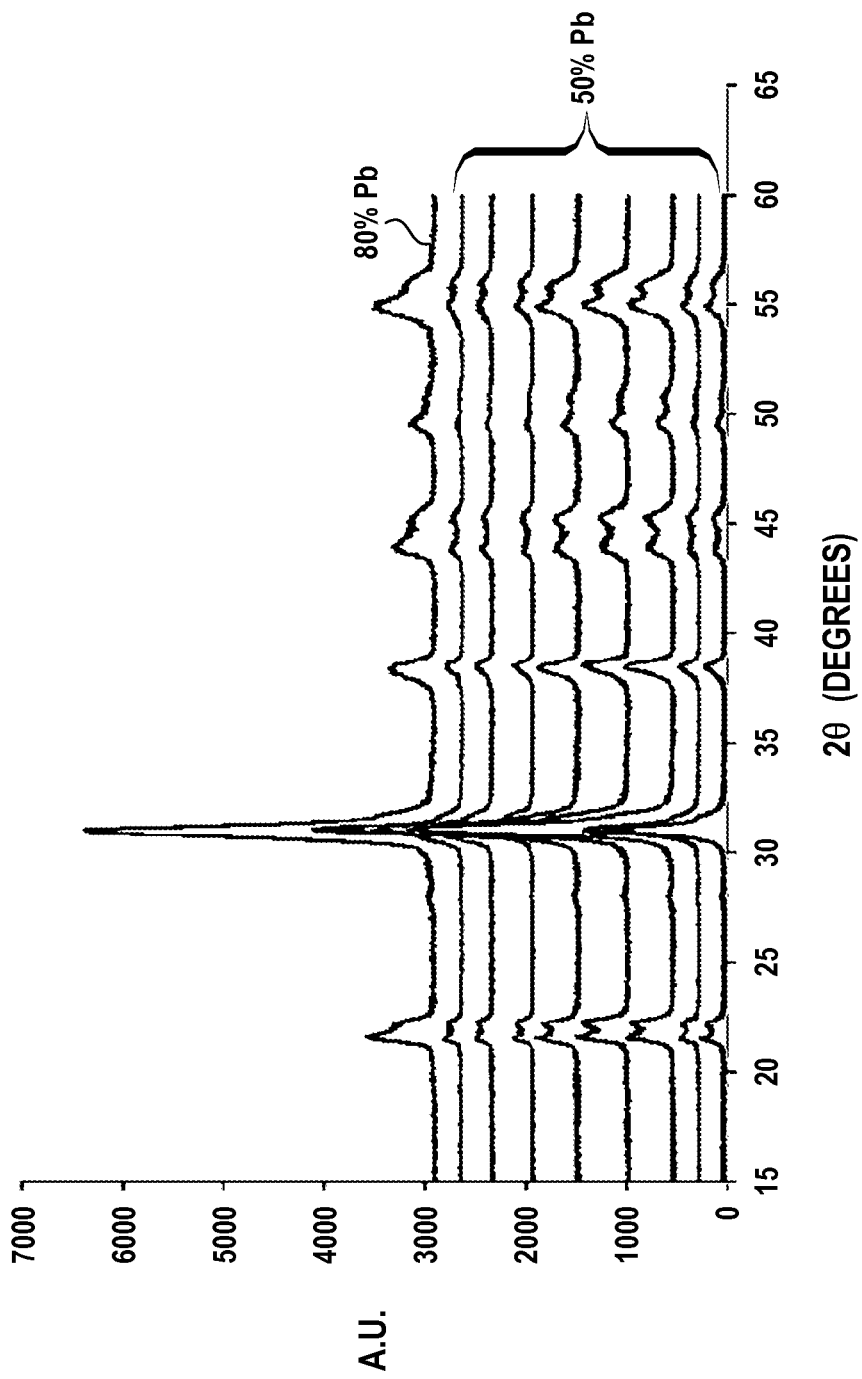
FIG. 14 graphically illustrates x-ray diffraction data obtained from PZT nanoparticles formed in accordance with embodiments provided herein.

Finally, FIG. 14 illustrates X-ray diffraction (XRD) patterns obtained by both the Example 2 method and the present method, as labeled in the figure. There are two notable aspects to FIG. 14. First, peaks from all samples appear at the same angle location. This indicates that all samples have similar chemical composition. Second, relative ratios of peak intensity are similar for all samples. This indicates that crystal structures are similar for all samples.

In conclusion, we have modified the hydrothermal process and recipe to expedite production of PZT nanoparticles. Major modification includes higher mineraliser concentration (2.75-3.5M), reduction of excess lead to 50%, elimination of furnace ramping, and shorter process time (2 hours). With these changes, the production rate is tripled compared to previous methods (i.e., Example 2) without significantly affecting morphology, crystal structures and chemical compositions of the produced PZT nanoparticles.

While illustrative embodiments have been illustrated and described, it will be appreciated that various changes can be made therein without departing from the spirit and scope of the invention.

The invention claimed is:

1. A method of forming a plurality of piezoelectric perovskite lead zirconium titanate (PZT) nanoparticles, the method comprising the steps of:

(a) providing a precursor solution comprising a mineraliser, titanium isopropoxide, zirconium n-propoxide, lead acetate trihydrate, acetylacetone, and water, wherein the lead acetate trihydrate, zirconium n-propoxide, and titanium isopropoxide are present in the precursor in a weight ratio of from about 1 to about 2 parts lead acetate trihydrate, from about 0.5 to about 1 parts zirconium n-propoxide, and from about 0.8 to about 1.6 parts titanium isopropoxide, and wherein the precursor solution comprises from about 10% to about 90%, by weight, of excess lead; and (b) heating the precursor solution to produce PZT nanoparticles, wherein heating the precursor solution comprises a first heating schedule that includes at least the sequential steps of:

(i) heating the precursor solution at a first rate to a first temperature, wherein said first rate is greater than about 1° C./min, and wherein said first temperature is between about 120° C. and about 350° C.;

(ii) holding for a first hold time at the first temperature, wherein said first hold time is between about 5 to about 300 minutes; and (iii) cooling at a second rate to provide a nanoparticle PZT solution comprising a suspended plurality of perovskite PZT nanoparticles having a smallest dimension of between about 20 nm and about 1000 nm, wherein said second rate is greater than about 1° C./min.

2. The method of claim 1, wherein the first rate is sufficiently fast that the PZT nanoparticles do not nucleate in the precursor solution during heating.

3. The method of claim 1, wherein during the first hold time the PZT nanoparticles nucleate to provide a nanoparticle solution comprising a suspended plurality of PZT nanoparticles.

4. The method of claim 1, wherein the second rate is sufficiently fast that the nanoparticle PZT solution becomes supersaturated.

5. The method of claim 1, wherein the mineraliser is selected from the group comprising KOH, NaOH, LiOH, NH4OH, and combinations thereof.

6. The method of claim 1, wherein the mineraliser has a concentration of between about 0.2 M and about 15 M.

7. The method of claim 1, wherein the first heating schedule is performed in a pressure-controlled atmosphere having a pressure of between about 1 atm and about 20 atm.

8. The method of claim 1, wherein the plurality of perovskite PZT nanoparticles have the formula $Pb_xZi_yTi_zO_3$, wherein x is between 0.8 and 2, wherein y is between 0.4 and 0.6, and wherein y plus z equals 1.

9. The method of claim 1, wherein the lead acetate trihydrate, zirconium n-propoxide, and titanium isopropoxide are present in the precursor in a weight ratio of greater than 1 to about 2 parts lead acetate trihydrate, from about 0.5 to about 1 parts zirconium n-propoxide, and from about 0.8 to about 1.6 parts titanium isopropoxide.

10. The method of claim 1, wherein the first rate is greater than about 10° C./min.

11. The method of claim 1, wherein the second rate is greater than about 10° C./min.

12. The method of claim 1, wherein the precursor solution includes about 40% to about 60%, by weight, of excess lead.

13. The method of claim 1, wherein the precursor solution includes about 50% to about 90%, by weight, of excess lead.

14. The method of claim 1, wherein the step of heating the precursor solution at a first rate comprises placing the precursor solution into a furnace heated to the first temperature.

15. A method of forming a plurality of piezoelectric perovskite lead zirconium titanate (PZT) nanoparticles, the method comprising the steps of:

(a) providing a precursor solution comprising a mineraliser, titanium isopropoxide, zirconium n-propoxide, lead acetate trihydrate, acetylacetone, and water, wherein the lead acetate trihydrate, zirconium n-propoxide, and titanium isopropoxide are present in the precursor in a weight ratio of from about 1 to about 2 parts lead acetate trihydrate, from about 0.5 to about 1 parts zirconium n-propoxide, and from about 0.8 to about 1.6 parts titanium isopropoxide; and (b) heating the precursor solution to produce PZT nanoparticles, wherein heating the precursor solution comprises a first heating schedule that includes at least the sequential steps of:

(i) heating the precursor solution at a first rate to a first temperature by placing the precursor solution into a furnace heated to the first temperature, wherein said first rate is greater than about 1° C./min, and wherein said first temperature is between about 120° C. and about 350° C.;

(ii) holding for a first hold time at the first temperature, wherein said first hold time is between about 5 to about 300 minutes; and (iii) cooling at a second rate to provide a nanoparticle PZT solution comprising a suspended plurality of perovskite PZT nanoparticles having a smallest dimension of between about 20 nm and about 1000 nm, wherein said second rate is greater than about 1° C./min.

16. The method of claim 1, wherein the precursor solution includes about 10% to about 90%, by weight, of excess lead.

17. The method of claim 1, wherein the precursor solution includes about 50% to about 90%, by weight, of excess lead.

* * * * *